(12) United States Patent
She et al.

(10) Patent No.: US 11,584,987 B2
(45) Date of Patent: Feb. 21, 2023

(54) SYSTEM AND METHOD FOR ENHANCING A DIFFUSION LIMITED CVI/CVD PROCESS

(71) Applicant: Goodrich Corporation, Charlotte, NC (US)

(72) Inventors: Ying She, East Hartford, CT (US); Brian St. Rock, Andover, CT (US)

(73) Assignee: Goodrich Corporation, Charlotte, NC (US)

( * ) Notice: Subject to any disclaimer, the term of this patent is extended or adjusted under 35 U.S.C. 154(b) by 156 days.

(21) Appl. No.: 16/927,843

(22) Filed: Jul. 13, 2020

(65) Prior Publication Data

US 2020/0340104 A1    Oct. 29, 2020

Related U.S. Application Data

(62) Division of application No. 16/164,315, filed on Oct. 18, 2018, now Pat. No. 10,752,988, which is a
(Continued)

(51) Int. Cl.
| | |
|---|---|
| C23C 16/04 | (2006.01) |
| C23C 16/26 | (2006.01) |
| C23C 16/455 | (2006.01) |
| C23C 16/458 | (2006.01) |
| C04B 35/83 | (2006.01) |

(Continued)

(52) U.S. Cl.
CPC ............ *C23C 16/045* (2013.01); *C04B 35/83* (2013.01); *C23C 16/26* (2013.01); *C23C 16/4557* (2013.01); *C23C 16/4581* (2013.01); *C23C 16/4583* (2013.01); *C23C 16/45502* (2013.01); *C23C 16/45523* (2013.01);
(Continued)

(58) Field of Classification Search
None
See application file for complete search history.

(56) References Cited

U.S. PATENT DOCUMENTS 5,348,774 A * 9/1994 Golecki ................ C04B 35/521
177/245
5,904,957 A   5/1999 Christin
(Continued)

FOREIGN PATENT DOCUMENTS

| EP | 0995813 | 4/2000 |
|---|---|---|
| EP | 1285976 | 2/2003 |

OTHER PUBLICATIONS

EP Search Report dated Sep. 8, 2017 in EP Application No. 17158363.6.
(Continued)

*Primary Examiner* — Joel G Horning
(74) *Attorney, Agent, or Firm* — Snell & Wilmer L.L.P.

(57) ABSTRACT

A system and method for enhancing a diffusion limited CVI/CVD process is provided. The system may densify a porous structure by flowing a reactant gas around the porous structure. A mass flow controller may be configured to pulse the flow rate of the reactant gas around the porous structure. The mass flow controller may pulse the flow rate from a nominal flow rate to a first flow rate. The mass flow controller may pulse the first flow rate back to the nominal flow rate or to a second flow rate. The mass flow controller may pulse the flow rate between the nominal flow rate, the first flow rate, and the second flow rate, as desired.

5 Claims, 5 Drawing Sheets

Related U.S. Application Data division of application No. 15/075,481, filed on Mar. 21, 2016, now Pat. No. 10,131,985.

(51) Int. Cl.
  *C23C 16/52*    (2006.01)
  *F16D 65/12*    (2006.01)

(52) U.S. Cl.
  CPC ............ *C23C 16/52* (2013.01); *F16D 65/126* (2013.01); *C04B 2235/614* (2013.01)

(56) References Cited

U.S. PATENT DOCUMENTS

| | | |
|---|---|---|
| 6,257,881 B1 | 7/2001 | Fiala et al. |
| 7,727,591 B2 | 6/2010 | Messier-Bugatti |
| 7,959,973 B2 | 6/2011 | Waghray et al. |
| 2003/0035893 A1* | 2/2003 | Daws ............... C23C 16/455 427/255.28 |
| 2005/0178327 A1 | 8/2005 | Rudolph |
| 2009/0053413 A1* | 2/2009 | Chang ............... C04B 35/6346 427/248.1 |
| 2012/0321779 A1* | 12/2012 | Vargas ............... C23C 16/08 427/2.26 |

OTHER PUBLICATIONS

USPTO; Restriction Requirement Office Action dated Sep. 19, 2017 in U.S. Appl. No. 15/075,481.
USPTO; Pre-Interview First Office Action dated Dec. 12, 2017 in U.S. Appl. No. 15/075,481.
USPTO; Final Office Action dated Mar. 21, 2018 in U.S. Appl. No. 15/075,481.
USPTO; Advisory Action dated Jun. 6, 2018 in U.S. Appl. No. 15/075,481.
USPTO; Notice of Allowance dated Sep. 21, 2018 in U.S. Appl. No. 15/075,481.
European Patent Office, European Office Action dated Oct. 8, 2019 in Application No. 17158363.6.
USPTO; Pre-Interview First Office Action dated May 20, 2020 in U.S. Appl. No. 16/164,315.
USPTO; Notice of Allowance dated Jun. 11, 2020 in U.S. Appl. No. 16/164,315.

* cited by examiner

SYSTEM AND METHOD FOR ENHANCING A DIFFUSION LIMITED CVI/CVD PROCESS

CROSS REFERENCE TO RELATED APPLICATIONS

This application is a divisional of, and claims priority to and the benefit of, U.S. Ser. No. 16/164,315 filed Oct. 18, 2019, entitled "SYSTEM AND METHOD FOR ENHANCING A DIFFUSION LIMITED CVI/CVD PROCESS," which is a divisional of, and claims priority to, U.S. Ser. No. 15/075,481 filed Mar. 21, 2016, entitled "SYSTEM AND METHOD FOR ENHANCING A DIFFUSION LIMITED CVI/CVD PROCESS," both of which are incorporated herein by reference in their entirety for all purposes.

FIELD

The present disclosure relates to chemical vapor infiltration and deposition processes ("CVI/CVD"), and more specifically, to a diffusion limited CVI/CVD process.

BACKGROUND

Chemical vapor infiltration and deposition (CVI/CVD) is a known process for making composite structures such as carbon/carbon brake disks. The CVI/CVD process typically used for making carbon/carbon brake disks is sometimes referred to as "conventional" or "isothermal" CVI/CVD. This process involves passing a reactant gas or gas mixture around heated stack of porous structures (e.g., a carbonized stack of porous structures) at absolute pressures as low as a few torr (~400 Pa or less). The gas diffuses into the stack of porous materials, driven by concentration gradients, and undergoes a CVD reaction such as thermal decomposition, hydrogen reduction, co-reduction, oxidation, carbidization, or nitridation to deposit a binding matrix.

During CVI/CVD, pores on the exterior of a stack of porous structures may become occluded. To resolve, one may remove the stack of porous structures from the process vessel and machine the stack of porous structures to open the pores. CVI/CVD may then be resumed.

SUMMARY

In various embodiments, a method for densifying an annular porous structure supported within a graphite susceptor is disclosed. The method may comprise flowing a reactant gas into an inner diameter (ID) volume. The reactant gas may flow at a nominal flow rate. The method may comprise flowing the reactant gas from the ID volume into an outer diameter (OD) volume. The ID volume may be in fluid communication with the OD volume. The reactant gas may form a boundary layer in proximity to an axially top surface and an axially bottom surface of the annular porous structure. The method may comprise pulsing the reactant gas into the ID volume to disturb the boundary layer and enhance a mass transfer process.

In various embodiments, the ID volume may be partially defined by the annular porous structure and the OD volume may be partially defined by the annular porous structure and the graphite susceptor. The method may further comprise flowing the reactant gas into a preheater. The preheater may heat the reactant gas to a defined temperature before flowing the reactant gas into the ID volume. Pulsing the reactant gas may also comprise pulsing the reactant gas by a mass flow controller. The mass flow controller may be configured to pulse the reactant gas and enhance the mass transfer process. The reactant gas may comprise at least one of methane, ethane, propane, cyclopentane, hydrogen, nitrogen, helium, argon, or an alkane. Pulsing the reactant gas may comprise pulsing the reactant gas from the nominal flow rate to a first flow rate. The first flow rate may be different from the nominal flow rate. The method may further comprise pulsing the reactant gas from the first flow rate to a second flow rate. The second flow rate may be different from the first flow rate.

In various embodiments, a system for densifying an annular porous structure is disclosed. The system may comprise a vessel and a graphite susceptor disposed within the vessel. The graphite susceptor may support the annular porous structure. A reactant gas feed line may be configured to flow reactant gas into the graphite susceptor. The reactant gas may be flowed at a nominal flow rate. A mass flow controller may be configured to pulse the nominal flow rate of the reactant gas to a first flow rate, wherein the first flow rate may be different from the nominal flow rate.

In various embodiments, the system for densifying an annular porous structure may further comprise a preheater. The preheater may be configured to receive the reactant gas from the reactant gas feed line, heat the reactant gas to a defined temperature, and flow the reactant gas into the graphite susceptor. The mass flow controller may be configured to pulse the reactant gas from the first flow rate to a second flow rate. The second flow rate may be different from the first flow rate. The reactant gas may comprise at least one of methane, ethane, propane, cyclopentane, hydrogen, nitrogen, helium, argon, or an alkane. The mass flow controller may be configured to pulse the reactant gas at the nominal flow rate based on an operational factor of the furnace. The operational factor may comprise at least one of a process temperature, a graphite susceptor volume pressure, a reactant gas concentration, a material property of the annular porous structure, an amount of porous structures loaded into the vessel of a furnace, a geometry of the furnace, or a geometry of the graphite susceptor.

In various embodiments, a method for densifying an annular porous structure supported within a graphite susceptor is disclosed. The method may comprise flowing a reactant gas into an outer diameter (OD) volume. The reactant gas may flow at a nominal flow rate. The method may comprise flowing the reactant gas from the OD volume into an inner diameter (ID) volume. The OD volume may be in fluid communication with the ID volume. The reactant gas may form a boundary layer in proximity to an axially top surface and an axially bottom surface of the annular porous structure. The method may comprise pulsing the reactant gas into the OD volume to disturb the boundary layer and enhance a mass transfer process.

In various embodiments, the ID volume may be partially defined by the annular porous structure and the OD volume may be partially defined by the annular porous structure and the graphite susceptor. The method may further comprise flowing the reactant gas into a preheater. The preheater may heat the reactant gas to a defined temperature before flowing the reactant gas into the OD volume. Pulsing the reactant gas may comprise pulsing the reactant gas by a mass flow controller. The mass flow controller may be configured to pulse the reactant gas and enhance the mass transfer process. The reactant gas may comprise at least one of methane, ethane, propane, cyclopentane, hydrogen, nitrogen, helium, argon, or an alkane. Pulsing the reactant gas may comprise pulsing the reactant gas from the nominal flow rate to a first flow rate. The first flow rate may be different from the nominal flow rate. The method may further comprise pulsing the reactant gas from the first flow rate to a second flow rate. The second flow rate may be different from the first flow rate.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the following illustrative figures. In the following figures, like reference numbers refer to similar elements and steps throughout the figures.

Figure 1:
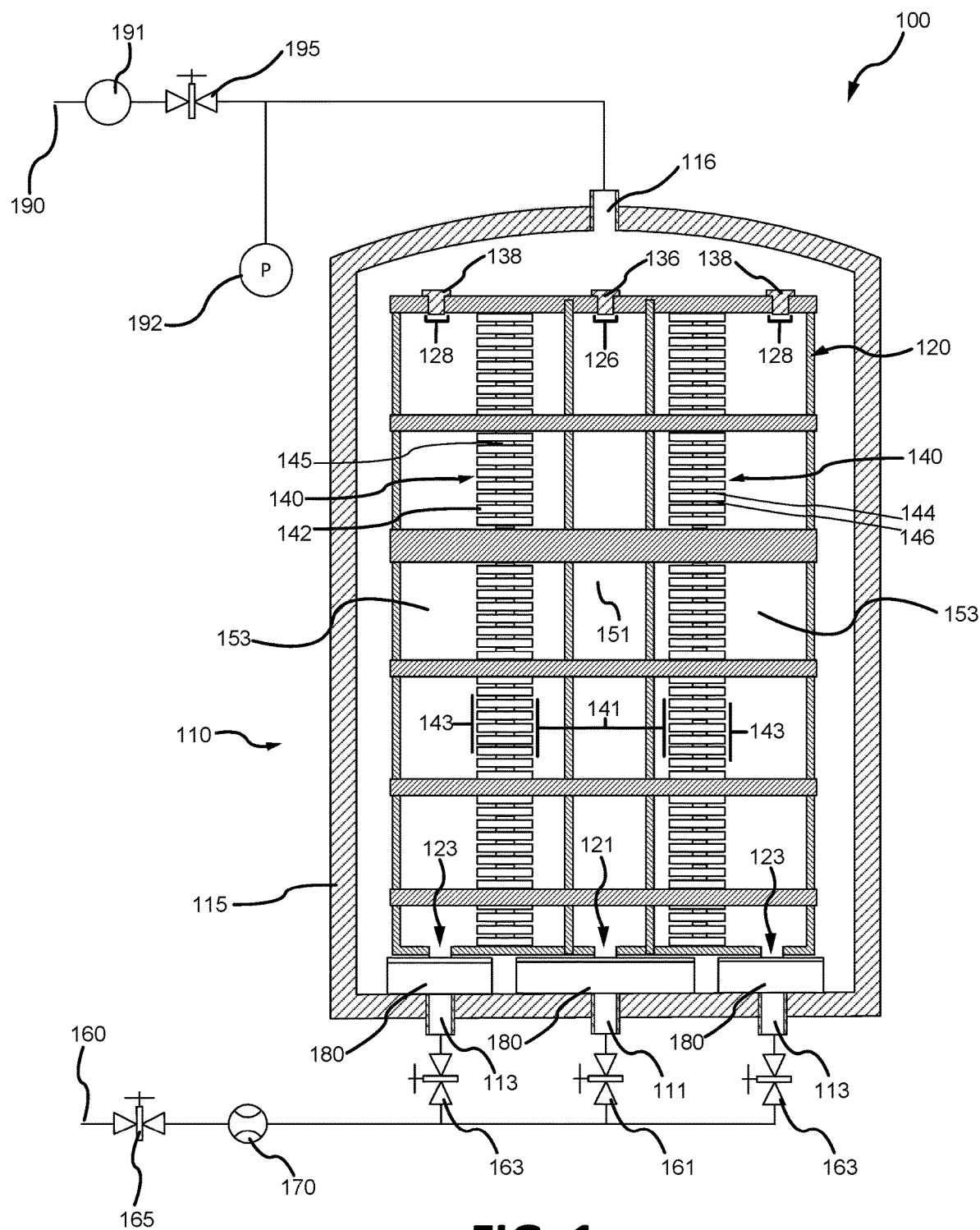
FIG. 1 illustrates a schematic view of a CVI/CVD apparatus, in accordance with various embodiments.

Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosures, it should be understood that other embodiments may be realized and that logical changes and adaptations in design and construction may be made in accordance with this disclosure and the teachings herein. Thus, the detailed description herein is presented for purposes of illustration only and not of limitation.

The scope of the disclosure is defined by the appended claims and their legal equivalents rather than by merely the examples described. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, coupled, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts but not necessarily to denote the same or different materials.

Carbon/carbon parts ("C/C") in the form of friction disks (also referred to as a carbon/carbon brake disks) are commonly used for aircraft brake disks, race car brakes, and clutch disks. Carbon/carbon brake disks are especially useful in these applications because of the superior high temperature characteristics of C/C material. In particular, the carbon/carbon material used in C/C parts is a good conductor of heat and is able to dissipate heat generated during braking away from the braking surfaces. Carbon/carbon material is also highly resistant to heat damage, and thus, is capable of sustaining friction between brake surfaces during severe braking without a significant reduction in the friction coefficient or mechanical failure. Furthermore, carbon/carbon brake disks are useful because they are relatively light weight, in particular in comparison to previous steel brakes.

One method of manufacturing C/C materials involves fabrication of a preform from an oxidized polyacrylonitrile (PAN) (also referred to as "OPF") or carbon fiber, followed by carbonization and chemical vapor infiltration (CVI) densification of the preform. As used herein, a preform may comprise any porous structure, and the terms preform, fibrous preform, and porous structure may be used interchangeably. The CVI/CVD process cycles are continued, in conjunction with machining the preform between infiltration cycles if desired, until the desired part density is achieved. In various embodiments, machining the surfaces of the preform may open surface porosity, thereby facilitating weight increases (i.e., density increases) in the preform during subsequent densification steps.

In general, C/C parts produced using the OPF, carbonization, and CVI/CVD densification method are made in three successive manufacturing steps. First, a preform is made utilizing a variety of textile manufacturing techniques. Typically, the preform is made from OPF or carbon fiber. Although numerous techniques are known in the art for making preforms from OPF, a common technique involves stacking layers of OPF to superimpose the layers. The added layers may then be needled perpendicularly to the layers with barbed textile needles. The needling process generates a series of z-fibers through the preform that extend perpendicularly to the fibrous layers. The z-fibers are generated through the action of the needles pushing fibers from within the layer (x-y or in-plane) and reorienting them in the z-direction (through-thickness). Needling of the preform may be done as one or more layers are added to the stack or may be done after the entire stack is formed. The needles may also penetrate through only a portion of the preform or may penetrate through the entire preform. In addition, resins are sometimes added to the preform by either injecting the resin into the preform following construction or coating the fibers or layers prior to forming the preform. Preforms may also be made from pitch based carbon fiber tows and/or from rayon carbon fiber tows.

After the preform is made, it is carbonized to convert the OPF into carbon fibers in a process referred to herein as carbonization/graphitization. Typically, preforms are carbonized by placing the preforms in a furnace with an inert atmosphere. As is well-understood by those in the art, the heat of the furnace causes a chemical conversion which drives off the non-carbon chemicals from the preform. Carbonization/graphitization may be conducted in a vacuum or partial vacuum (e.g., at pressures of 1-15 torr) or in an inert atmosphere at a temperature in the range from about 1,400° C. to about 2,800° C. (2,552° F. to about 5,072° F.), and in various embodiments in the range from about 1,400° C. to about 2,500° C. (2,552° F. to about 4,532° F.), and in various embodiments in the range from about 1,400° C. to about 2,200° C. (2,552° F. to about 3,992° F.) (wherein the term about in this context only means+/−100° C.) for a period of time in the range of up to about 60 hours, and in various embodiments, in the range up to about 10 hours (wherein the term about in this context only means+/−2 hours). The resulting preform generally has the same fibrous structure as the preform before carbonizing. However, the OPF have been converted to 100% carbon or very near 100%, for example from 95% carbon to 99.9% carbon. The resulting preform may be referred to as having a fibrous network. In various embodiments, the preform may comprise any geometry.

After the preform has been carbonized, the preform is densified. The preform may be referred to as a "porous structure" before and during densification. In general, densification involves filling the voids, or pores, of the preform with additional carbon material. This may be done using the same furnace used for carbonization or a different furnace. Typically, chemical vapor infiltration and deposition ("CVI/CVD") techniques are used to densify the preform with a carbon matrix. This commonly involves heating the furnace and the preforms, and flowing a reactant gas comprising, for example, hydrocarbon gases (e.g., at least one of methane, ethane, propane, butane, and/or the like, as described herein) into the furnace and around and through the preforms. The hydrocarbons may comprise alkanes, for example, straight chain, branched chain and/or cyclic alkanes, having from 1 to about 8 carbon atoms, and in various embodiments from 1 to about 6 carbon atoms, and in various embodiments from 1 to about 3 carbon atoms. Methane, ethane, propane, cyclopentane, or mixtures of two or more thereof may be used. The reactant gas may comprise one or more alkanes of 2 to about 8 carbon atoms, and in various embodiments from 2 to about 6 carbon atoms. Mixtures of one or more alkanes of 1 to about 8 carbon atoms with one or more alkenes of 2 to about 8 carbon atoms may be used. In various embodiments, the CVI/CVD process may include a temperature gradient. In various embodiments, the CVI/CVD process may include a pressure differential. As used herein, CVI/CVD may refer to chemical vapor infiltration or chemical vapor deposition. Accordingly, CVI/CVD may refer to chemical vapor infiltration or deposition.

CVI/CVD densification may be conducted in a vacuum or partial vacuum (e.g., at pressures of 1-15 torr (133 Pa to 1999 Pa) or in an inert atmosphere at a temperature in the range from about 900° C. to about 1100° C. (1,652° F. to about 2012° F.), and in various embodiments in the range of up to about 1,000° C. (1,832° F.) (wherein the term about in this context only means+/−100° C.) for a period of time in the range from about 150 hours to about 550 hours, and in various embodiments, in the range from about 300 hours to about 700 hours (wherein the term about in this context only means+/−24 hours). The number of hours used in a CVI/CVD process may be referred to as hours on gas ("HOG").

As a result, carbon is decomposed or pyrolyzed from the hydrocarbon reactant gases and is deposited on and within the preforms. Typically, the densification process is continued until the preform reaches a density in the range from 1.6 to 1.9 grams per cubic centimeter (g/cc), and in various embodiments, a density of approximately 1.75 g/cc. When the densification step is completed, the resulting C/C part has a carbon fiber structure with a carbon matrix infiltrating the fiber structure, thereby deriving the name "carbon/carbon."

The term "composite structure" may refer to a densified porous structure. The composite structure may comprise a porous structure with a solid residue or matrix dispersed within. The composite structure may comprise a carbonaceous porous structures with a carbonaceous matrix dispersed within. This may be referred to as a carbon/carbon composite. The composite structure may comprise a ceramic porous structure with a ceramic or oxide matrix dispersed within. The composite structure may comprise a mixed or hybrid composite structure such as a carbon porous structure with a ceramic or oxide matrix dispersed within, a carbon porous structure with a mix of carbon and ceramic or oxide matrix dispersed within, a ceramic porous structure with a carbon matrix dispersed within, a ceramic porous structure with a mix of carbon and ceramic or oxide matrix dispersed within, and/or the like. In various embodiments, the composite structure may comprise carbon, silicon, silicon carbide, silicon nitride, boron, boron carbide, aluminum nitride, titanium nitride, cubic zirconia, and $SiC_xN_y$, where x is a number in the range from about zero to about 1, and y is a number in the range from about zero to about 4/3. The composite structure may comprise a first surface, a second surface and at least one other surface connecting the first surface and the second surface. In various embodiments, and as used herein, any surface may comprise any suitable shape, such as, for example, at least one of rounded, sphere shaped, toroid shaped, or frustoconical.

The terms "higher order rough laminar structure," "rough laminar microstructure," "transitional microstructure," "smooth laminar microstructure," "transitional microstructure," "dark laminar" and "isotropic" may be used to describe the microstructure of a composite structure employing a carbon matrix dispersed in the porous materials. The microstructure may be determined by use of polarized light microscopy. A carbon/carbon composite with a rough laminar structure may be characterized as having high optical activity and numerous irregular extinction crosses. A carbon/carbon composite with a smooth laminar structure may be characterized as having low optical activity and smooth extinction crosses. A carbon/carbon composite with little to no optical activity may be characterized as dark laminar or isotropic. These microstructures may be quantified in terms of their extinction angles.

Composite structures made according to various embodiments may be useful as carbon/carbon aircraft disk brakes, ceramic combustion and turbine components such as turbine engine hot section components, ceramic friction materials, ceramic heat sinks, and the like. The carbon/carbon disk brakes may be in the form of circular disks or disks.

As used herein, the term "stack of porous structures" may be interchangeable with "porous structures stack." A porous structure stack may comprise any number of porous structures on top of one another. In this regard, the porous structures may be in contact with each other in the porous structure stack. The porous structure stack may also comprise porous structures stacked on top of one another, with spacers, and/or other hardware, separating each individual porous structure. In this regard, the porous structures may be stacked such that each porous structure is not in contact with another porous structure (i.e., the spacers are in contact with the porous structures).

In various embodiments, pressure differentials may also be used with thermal gradients. A pressure differential may be created when pressure on one surface of a stack of porous structures is different than the pressure at another surface of the stack of porous structures.

In conventional systems for CVI/CVD densification, soot and/or tar may coat surfaces of the stack of porous structures. Soot may refer to undesirable accumulations of carbon particles on the furnace equipment and/or stack of porous structures, and tar may refer to undesirable accumulations of large hydrocarbon molecules on the furnace equipment/stack of porous structures. The large hydrocarbon molecules may cause thick coatings on the surfaces of the stack of porous structures. Typically, accumulations of soot and/or tar form when the reactant gas stagnates for a period of time in an area or comes into contact with cooler furnace surfaces. Stagnation typically occurs in areas where the gas flow is blocked or where the gas flow is moving more slowly than the surrounding gas flow.

Accumulations of soot and tar can cause a number of problems which affect both the quality of the composite structures and the costs of manufacturing. Seal-coating is one typical problem that can result from soot and tar, although seal-coating can also be caused by other conditions that are described below. Seal-coating may occur when soot and/or tar deposit excess carbon early in the densification process on surfaces of the porous structures. As the carbon accumulates on the surfaces of the stack of porous structures, the surface pores eventually become blocked (i.e., occluded), or sealed, thus preventing the flow of reactant gas from further permeating the stack of porous structures. As a result, densification of the interior region around the seal-coated surface prematurely stops, thereby potentially leaving interior porous defects in the finished carbon part (i.e., the densified preform).

To address the occlusion of pores in a porous structure, conventionally, multiple densification steps were employed. Stated another way, a CVI/CVD process would be stopped, the furnace allowed to cool, and the porous structure would be extracted and machined to open the pores. Then, the porous structure would be placed into the furnace and the CVI/CVD process would commence again in a second CVI/CVD process step. The rearrangement and machining of the porous structures between cycles (steps) is costly and time-consuming. Thus, in various embodiments, disclosed herein is a CVI/CVD process that may begin with a porous structure that has previously not undergone a CVI/CVD process and achieve a commercially viable density of that porous structure (e.g., reaches a density in the range from 1.6 g/cc to 1.9 g/cc), and in various embodiments, a density of approximately 1.75 g/cc) in a single cycle. In this regard, in various embodiments, a porous structure may be manufactured without use of multiple cycles.

In various embodiments, CVI/CVD processes are disclosed herein, where in-process pulsing of the flow of reactant gas is implemented in a single processing cycle. Pulsing the flow of reactant gas may allow for more reactant material to infiltrate into the porous structures during a CVI/CVD process cycle, thereby allowing a commercially-viable density to be achieved in a single processing cycle.

In various embodiments, and with reference to FIG. 1, a system 100 for densifying an annular porous structure is disclosed. System 100 may comprise a furnace 110. A number of different types of furnaces 110 may be used for CVI/CVD processes. Typically, furnace 110 may include a vessel 115 that encloses a graphite susceptor 120. Graphite susceptor 120 may enclose one or more porous structure stacks 140 that are to undergo a CVI/CVD process.

In various embodiments, to provide for the flow of reactant gas and to facilitate discharge of reactant gas exhaust, vessel 115 of furnace 110 may comprise a number of inlet ducts and outlet ducts. The inlet ducts and outlet ducts may comprise a void in vessel 115, allowing the passage of reactant gas through vessel 115. In this regard, vessel 115 may comprise an inner diameter (ID) inlet duct 111 and at least one outer diameter (OD) inlet duct 113. ID inlet duct 111 and OD inlet ducts 113 may allow reactant gas to flow into furnace 110, through vessel 115. Vessel 115 may also comprise an outlet duct 116 configured to allow reactant gas to flow out furnace 110, through vessel 115.

In various embodiments, graphite susceptor 120 may be disposed within furnace 110 and may be induction heated by an induction coil or gas flame. Although induction heating is described herein, other methods of heating may also be used such as gas heating, resistance heating, microwave heating, and/or the like, any of which are considered to fall within the present disclosure. Graphite susceptor 120 may comprise a number of inlet openings and outlet openings to provide for the flow of reactant gas and to facilitate discharge of reactant gas exhaust. The inlet openings and outlet openings may comprise a void in graphite susceptor 120, allowing the passage of gas through graphite susceptor 120.

In this regard, graphite susceptor 120 may comprise an ID inlet opening 121 and at least one OD inlet opening 123. ID inlet opening 121 and OD inlet openings 123 may allow reactant gas to flow into graphite susceptor 120. ID inlet opening 121 may be in fluid communication with ID inlet duct 111 such that reactant gas may flow through vessel 115 and into graphite susceptor 120. OD inlet openings 123 may be in fluid communication with OD inlet ducts 113 such that reactant gas may flow through vessel 115 and into graphite susceptor 120. Graphite susceptor 120 may also comprise an ID outlet opening 126 and at least one OD outlet openings 128. ID outlet opening 126 and OD outlet openings 128 may allow reactant gas to flow out graphite susceptor 120. ID outlet opening 126 may be fluidly coupled and/or substantially aligned with outlet duct 116, such that reactant gas may flow through graphite susceptor 120 and exit through vessel 115. OD outlet openings 128 may be fluidly coupled with outlet duct 116 such that reactant gas may flow through graphite susceptor 120 and exit through vessel 115.

In various embodiments, outlet plugs may be configured to restrict the flow of reactant gas through ID outlet opening 126 and OD outlet openings 128. An ID outlet plug 136 may be used to restrict reactant gas flow from ID outlet opening 126, and an at least one OD outlet plug 138 may be used to restrict reactant gas flow from OD outlet openings 128. ID outlet plug 136 and OD outlet plugs 138 may comprise graphite and/or other suitable high-temperature materials. ID outlet plug 136 and OD outlet plugs 138 may comprise a solid graphite weight configured to maintain an airtight seal on graphite susceptor 120 by force of gravity asserting significant downward pressure over ID outlet opening 126 and OD outlet openings 128, respectively.

In various embodiments, one or more porous structure stacks 140 may be enclosed within graphite susceptor 120. The porous structure stacks 140 may comprise a plurality of porous structures 142, spaced vertically in porous structure stacks 140 by a plurality of spacers 145. Porous structures 142 may comprise an annular shape. Porous structures 142 may comprise an axially top surface 144 and an axially bottom surface 146. Porous structure stacks 140 may be disposed within graphite susceptor 120 to effectively divide the volumetric space within graphite susceptor 120. For example, porous structure stacks 140 may be disposed to define an ID volume 151 and an OD volume 153. In this regard, ID volume 151 may partially define a volumetric space within graphite susceptor 120 located radially inward from an ID surface 141 on an inner diameter of porous structure stacks 140. OD volume 153 may partially define a volumetric space within graphite susceptor 120 located radially outward from an OD surface 143 on an outer diameter of porous structure stacks 140 and radially inward from an inner surface of graphite susceptor 120. ID volume 151 and OD volume 153 may be in fluid communication via spacers 145 of porous structure stacks 140. In this regard, reactant gas may pass from ID volume 151 to OD volume 153, or from OD volume 153 to ID volume 151, through spacers 145 and around axially top surface 144 and axially bottom surface 146 of porous structure 142.

In various embodiments, spacers 145 may comprise solid rings. Spacers 145 may also comprise rings with voids configured to allow fluid communication between OD volume 153 and ID volume 151, in various embodiments. Where a solid ring is used for spacers 145, the pressure differential may develop more rapidly between OD volume 153 and ID volume 151 than where spacers 145 comprise rings having voids. In various embodiments, spacers 145 may comprise both solid rings and rings having voids. Spacers 145 may comprise carbon/carbon, graphite, and/or any other suitable material. Spacers 145 may also comprise a surface coating to prevent spacers 145 from adhering to porous structures 142.

In various embodiments, a reactant gas feed line 160 may be configured to facilitate flow of reactant gas from a reactant gas source into furnace 110. An inlet control valve 165 may be in fluid communication with reactant gas feed line 160 and may be configured to allow or restrict the flow of reactant gas into furnace 110. Inlet control valve 165 may also be in fluid communication with an ID inlet valve 161 and at least one OD inlet valve 163. Thus, actuation of inlet control valve 165 may operate to supply and restrict reactant gas to ID inlet valve 161 and OD inlet valves 163. ID inlet valve 161 may be in fluid communication with ID inlet duct 111, and may be configured to control the flow of reactant gas into ID inlet duct 111. In this regard, ID inlet valve 161 may enable the flow of reactant gas through ID inlet duct 111 and ID inlet opening 121, and into ID volume 151. OD inlet valves 163 may be in fluid communication with OD inlet ducts 113, and may be configured to control the flow of reactant gas into OD inlet ducts 113. In this regard, OD inlet valves 163, may enable the flow of reactant gas through OD inlet ducts 113 and OD inlet openings 123, and into OD volume 153.

In various embodiments, a mass flow controller 170 may be in fluid communication with reactant gas feed line 160. Mass flow controller 170 may be configured to control a flow rate (volume as a measure of time) of the reactant gas into furnace 110. In this regard, mass flow controller 170 may be configured to pulse the flow rate of the reactant gas into furnace 110. The terms "pulse", "pulsing", and/or the like may refer to mass flow controller 170 increasing or decreasing the flow rate of the reactant gas, from a nominal flow rate. The nominal flow rate may comprise a flow rate of the reactant gas that is optimized based on operational factors. Operational factors may comprise a variety of factors relating to the CVI/CVD process, such as CVI/CVD process temperatures, graphite susceptor 120 volume pressures, reactant gas concentrations, material properties of porous structure 142, amount of porous structures 142 loaded into furnace 110, geometry of furnace 110, geometry of graphite susceptor 120, HOG, etc.

In various embodiments, mass flow controller 170 may be configured to pulse the nominal flow rate to a first flow rate. The first flow rate may comprise a flow rate that is increased from the nominal flow rate. For example, the first flow rate may comprise an increase of about 5% to about 15%, about 15% to about 25%, about 25% to about 35%, and/or about 35% to about 50% (wherein the term about in this context only means+/−2%). The first flow rate may also comprise any other suitable increase compared to the nominal flow rate. The first flow rate may also comprise a flow rate that is decreased from the nominal flow rate. For example, the first flow rate may comprise a decrease of about 5% to about 15%, about 15% to about 25%, about 25% to about 35%, and/or about 35% to about 50% (wherein the term about in this context only means+/−2%). The first flow rate may also comprise any other suitable decrease compared to the nominal flow rate.

In various embodiments, mass flow controller 170 may be configured to pulse the first flow rate back to the nominal flow rate. Mass flow controller 170 may also be configured to pulse the first flow rate to a second flow rate. The second flow rate may comprise an increase compared to the first flow rate. For example, the second flow rate may comprise an increase of about 5% to about 15%, about 15% to about 25%, about 25% to about 35%, and/or about 35% to about 50% (wherein the term about in this context only means+/−2%). The second flow rate may also comprise a decrease compared to the first flow rate. For example, the second flow rate may comprise a decrease of about 5% to about 15%, about 15% to about 25%, about 25% to about 35%, and/or about 35% to about 50% (wherein the term about in this context only means+/−2%).

In various embodiments, mass flow controller 170 may pulse the flow rate of the reactant gas between the nominal flow rate, the first flow rate, and the second flow rate based on the operational factors. For example, and based on the operational factors, mass flow controller may pulse the flow rate at a frequency of 10 seconds, 30 seconds, 1 minute, 5 minutes, 10 minutes, 20 minutes, 30 minutes, and/or at any other suitable frequency. Mass flow controller 170 may be configured to pulse the flow rate during the entire HOG of the CVI/CVD process, or may pulse the flow rate only during a defined range of HOGs. For example, mass flow controller 170 may pulse the flow rate during the first 100 HOGs and the last 100 HOGs, and/or during any other suitable range of HOG.

In various embodiments, a preheater 180 may be configured to heat the reactant gas before the reactant gas flows into graphite susceptor 120. For example, preheater 180 may comprise a series of graphite plates with voids, heated by an induction coil and/or graphite susceptor 120. System 100 may comprise a single preheater 180, configured to receive and heat reactant gas prior to the reactant gas flowing into graphite susceptor 120. Preheater 180 may be in fluid communication with ID inlet duct 111 and OD inlet ducts 113 to receive reactant gas. System 100 may also comprise multiple preheaters 180, such that ID inlet duct 111 and OD inlet ducts 113 each flow reactant gas into a separate preheater 180. Preheater 180 may receive reactant gas and heat the reactant gas to a defined temperature. The reactant gas may then flow into graphite susceptor 120. In this regard, preheater 180 may be fluidly sealed to prevent reactant gas from leaking out of preheater 180. Preheater 180 may flow the reactant gas into graphite susceptor 120 through ID inlet opening 121 and/or OD inlet openings 123.

In various embodiments, an exhaust line 190 may be configured to withdraw reactant gas from furnace 110. Exhaust line 190 may be in fluid communication with outlet duct 116. A vacuum pump 191 may be in fluid communication with exhaust line 190. Vacuum pump 191 may be configured to provide a suction source to evacuate furnace 110 through exhaust line 190. A pressure transducer 192 may also be in fluid communication with exhaust line 190. Pressure transducer 192 may be configured to measure the pressure of the reactant gas as the reactant gas is evacuated from furnace 110.

In various embodiments, an exhaust control valve 195 may be in fluid communication with exhaust line 190 and may be configured to control the suction from vacuum pump 191 to furnace 110. Thus, actuation of exhaust control valve 195 may operate to supply and restrict suction to furnace 110. In this regard, exhaust control valve 195 may control the evacuation of reactant gas from ID volume 151 through ID outlet opening 126, via outlet duct 116, and the evacuation of reactant gas from OD volume 153 through OD outlet openings 128, via outlet duct 116.

Figure 2:
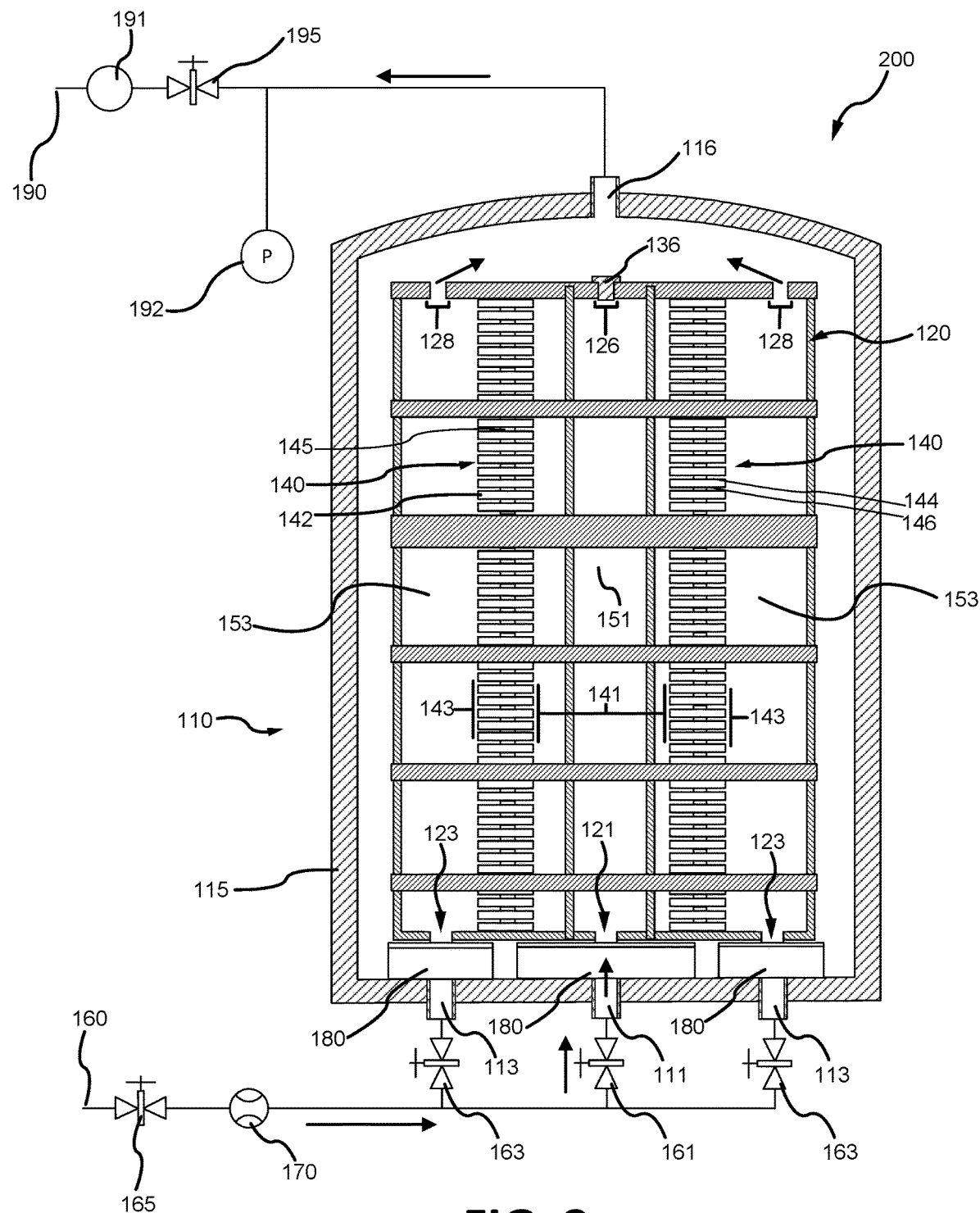
FIG. 2 illustrates a schematic view of a CVI/CVD apparatus configured for inner diameter (ID) gas feed, in accordance with various embodiments.

In various embodiments, and with reference to FIG. 2, a system 200 for densifying an annular porous structure may be configured for an inner diameter (ID) feed. In this regard, reactant gas may flow into ID volume 151 by way of ID inlet valve 161 and through ID inlet duct 111, preheater 180, and ID inlet opening 121. OD inlet valves 163 may be configured to restrict the flow of reactant gas, such that reactant gas is only flowed into ID volume 151, and not into OD volume 153. ID outlet plug 136 may be inserted into ID outlet opening 126 to prevent reactant gas from escaping ID volume 151. As reactant gas continues to flow into ID volume 151, and the pressure within ID volume 151 increases, the reactant gas is flowed through porous structure stacks 140, passing around axially top surface 144 and axially bottom surface 146 of porous structures 142, and through spacers 145. A portion of the reactant gas may decompose or pyrolyze and deposit within porous structures 142. The reactant gas may then flow into OD volume 153 by way of porous structure stacks 140.

In various embodiments, the reactant gas may then be withdrawn from OD volume 153. In this regard, reactant gas may exhaust from OD volume 153 by way of exhaust control valve 195, via exhaust line 190, and through OD outlet openings 128 and outlet duct 116. Vacuum pump 191 may provide suction, via exhaust line 190 and through control of exhaust control valve 195, into furnace 110. OD outlet openings 128 may be left open, with no inserted plug (e.g., OD outlet plugs 138 in FIG. 1), to facilitate reactant gas flow.

Figure 3:
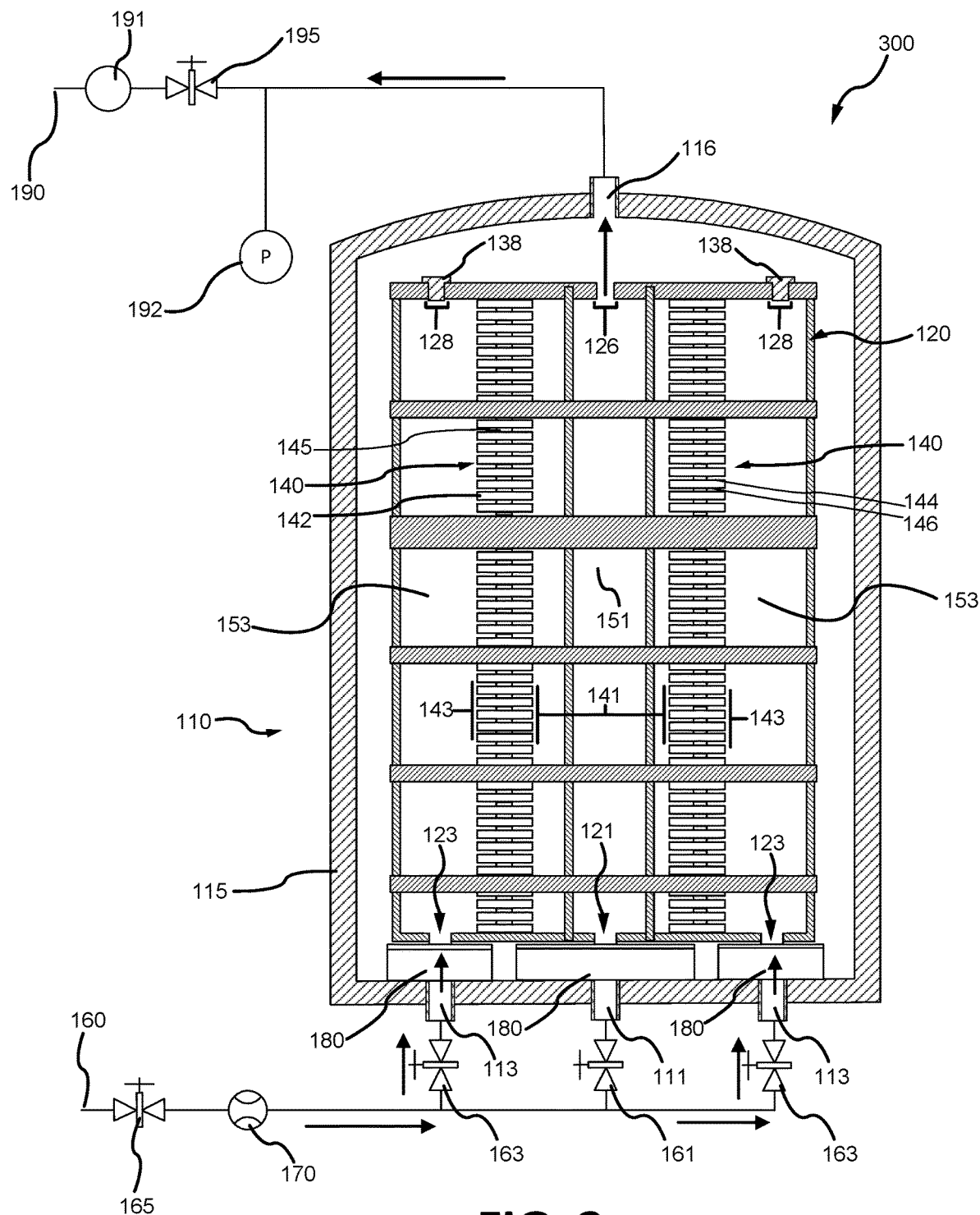
FIG. 3 illustrates a schematic view of a CVI/CVD apparatus configured for outer diameter (OD) gas feed, in accordance with various embodiments.

In various embodiments, and with reference to FIG. 3, a system 300 for densifying an annular porous structure may be configured for an outer diameter (OD) feed. In this regard, reactant gas may flow into OD volume 153 by way of OD inlet valves 163 and through OD inlet ducts 113, preheater 180, and OD inlet openings 123. ID inlet valve 161 may be configured to restrict the flow of reactant gas, such that reactant gas is only flowed into OD volume 153, and not into ID volume 151. OD outlet plugs 138 may be inserted into OD outlet openings 128 to prevent reactant gas from escaping OD volume 153. As reactant gas continues to flow into OD volume 153, and the pressure within OD volume 153 increases, the reactant gas is flowed through porous structure stacks 140, passing around axially top surface 144 and axially bottom surface 146 of porous structures 142, and through spacers 145. A portion of the reactant gas may decompose or pyrolyze and deposit within porous structures 142. The reactant gas may then flow into ID volume 151 by way of porous structure stacks 140.

In various embodiments, the reactant gas may then be withdrawn from ID volume 151. In this regard, reactant gas may exhaust from ID volume 151 by way of exhaust control valve 195 and through ID outlet opening 126 and outlet duct 116. Vacuum pump 191 may provide suction, via exhaust line 190 and through control of exhaust control valve 195, into furnace 110. ID outlet opening 126 may be left open, with no inserted plug (e.g., ID outlet plug 136 in FIG. 1), to facilitate reactant gas flow.

With further reference to FIGS. 2 and 3, the process of flowing the reactant gas through porous structure stacks 140 (from either ID volume 151 or OD volume 153) may be referred to as a diffusion limited step. The diffusion limited step may be a slow carbon deposition process in the CVI/CVD process that relies on the diffusion of reactants into the insides of porous structures 142, instead of flowing the reactants through porous structures 142 (such as in a pressure gradient step). When the reactant gas flows along axially top surface 144 and axially bottom surface 146 of porous structures 142, the reactants infiltrate into the pores of porous structures 142. During the diffusion limited step, a boundary layer forms between the reactant gas proximate to the outer surfaces of porous structure 142 (axially top surface 144, axially bottom surface 146, ID surface 141, and OD surface 143). The boundary layer may comprise the layer of reactant gas in the immediate vicinity of porous structure 142, resulting in a mass transfer resistance and slowing of the amount of reactants that can infiltrate into the pores of porous structure 142.

Figure 4:
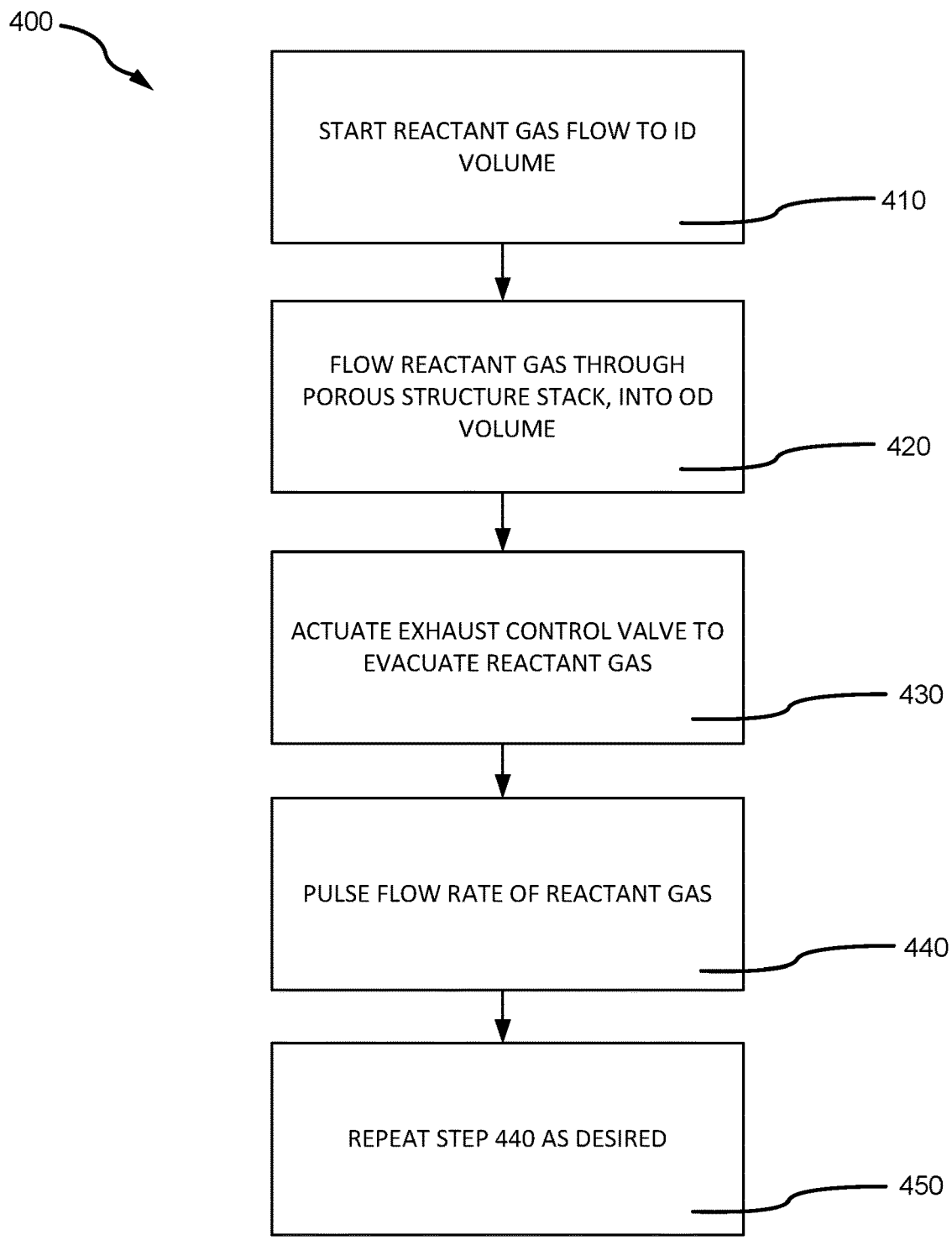
FIG. 4 illustrates a process flow for a method of enhancing a diffusion limited CVI/CVD process, in accordance with various embodiments.

In various embodiments, and with reference to FIGS. 2 and 4, a method 400 for enhancing a diffusion limited CVI/CVD process is disclosed. Method 400 may be used to thin the boundary layer during the diffusion limited step, allowing a greater amount of reactants to infiltrate into the pores of porous structure 142. In this regard, method 400 may thin the boundary layer by pulsing the flow rate of the reactant gas. Pulsing the flow rate of the reactant gas may disturb the boundary layer, enhancing the mass transfer process of reactants into porous structures 142.

In various embodiments, method 400 may comprise starting a reactant gas flow to ID volume 151 (step 410). Inlet control valve 165 may be actuated to allow the flow of reactant gas from reactant gas feed line 160, through ID inlet valve 161, and into ID volume 151. Mass flow controller 170 may control the rate of flow of the reactant gas to a nominal flow rate. Method 400 may comprise flowing the reactant gas through porous structure stacks 140 and into OD volume 153 (step 420), at the nominal flow rate. As the reactant gas flows into ID volume 151, pressure may build, causing the reactant gas to flow through porous structure stacks 140 and into OD volume 153. The reactant gas may flow through porous structure stacks 140 by flowing around porous structures 142 and through spacers 145. Method 400 may comprise actuating exhaust control valve 195 to evacuate the reactant gas (step 430). Exhaust control valve 195 may be actuated to allow suction from vacuum pump 191 to evacuate reactant gas from OD volume 153, via exhaust line 190.

In various embodiments, method 400 may comprise pulsing the reactant gas flow (step 440). Mass flow controller 170 may be configured to pulse the flow rate of the reactant gas. In this regard, mass flow controller 170 may pulse the flow rate from the nominal flow rate to a first flow rate. Mass flow controller 170 may pulse the flow rate from the first flow rate back to the nominal flow rate. Mass flow controller 170 may also pulse the flow rate from the first flow rate to a second flow rate. Step 440 may comprise pulsing the flow rate based on operational factors. Step 440 may comprise pulsing the flow rate at any suitable frequency, and throughout the CVI/CVD process. For example, in response to mass flow controller 170 pulsing the flow rate, the boundary layer of the reactant gas may be initially disturbed, reducing the mass transfer resistance. The boundary layer may then begin to stabilize again, as the flow rate of the reactant gas also stabilizes. Mass flow controller 170 may intermittently pulse the reactant gas flow again to disturb the boundary layer and enhance the mass transfer process.

In various embodiments, method 400 may comprise repeating step 440, as desired (step 450). In this regard, mass flow controller 170 may pulse the flow rate between the nominal flow rate, the first flow rate, and the second flow rate, to thin the boundary layer of the reactant gas passing through porous structure stacks 140, throughout the CVI/CVD process. Step 450 may comprise repeating step 440 based on the operational factors.

Figure 5:
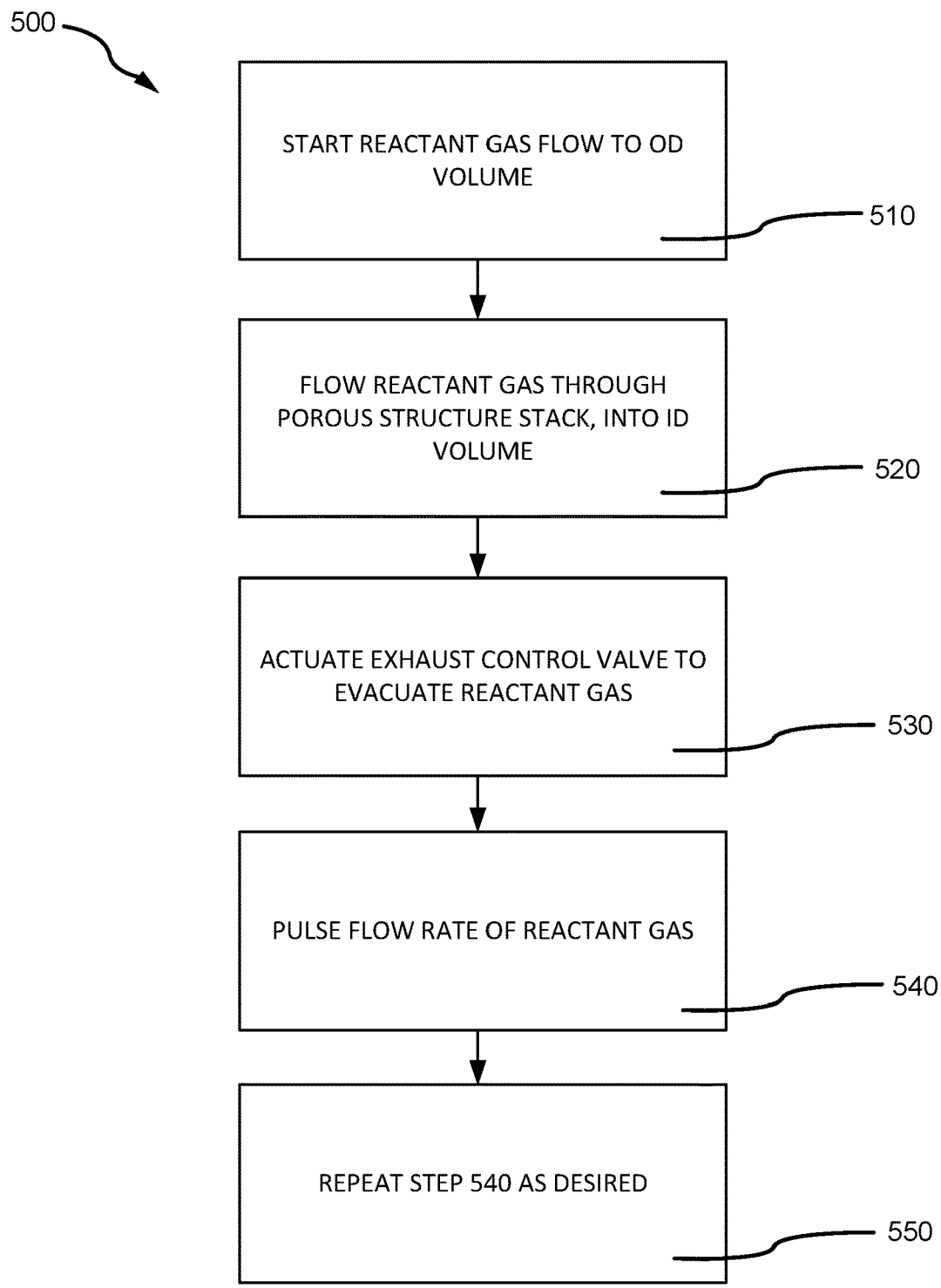
FIG. 5 illustrates a process flow for a method of enhancing a diffusion limited CVI/CVD process, in accordance with various embodiments.

In various embodiments, and with reference to FIGS. 3 and 5, a method 500 for enhancing a diffusion limited CVI/CVD process is disclosed. Method 500 may be used to thin the boundary layer during the diffusion limited step, allowing a greater amount of reactants to infiltrate into the pores of porous structure 142. In this regard, method 500 may thin the boundary layer by pulsing the flow rate of the reactant gas. Pulsing the flow rate of the reactant gas may disturb the boundary layer, enhancing the mass transfer process.

In various embodiments, method 500 may comprise starting a reactant gas flow to OD volume 153 (step 510). Inlet control valve 165 may be actuated to allow the flow of reactant gas from reactant gas feed line 160, through OD inlet valves 163, and into OD volume 153. Mass flow controller 170 may control the rate of flow of the reactant gas to a nominal flow rate. Method 500 may comprise flowing the reactant gas through porous structure stacks 140 and into ID volume 151 (step 520), at the nominal flow rate. As the reactant gas flows into OD volume 153, pressure may build, causing the reactant gas to flow through porous structure stacks 140 and into ID volume 151. The reactant gas may flow through porous structure stacks 140 by flowing around porous structures 142 and through spacers 145. Method 500 may comprise actuating exhaust control valve 195 to evacuate the reactant gas (step 530). Exhaust control valve 195 may be actuated to allow suction from vacuum pump 191 to evacuate reactant gas from ID volume 151, via exhaust line 190.

In various embodiments, method 500 may comprise pulsing the reactant gas flow (step 540). Mass flow controller 170 may be configured to pulse the flow rate of the reactant gas. In this regard, mass flow controller 170 may pulse the flow rate from the nominal flow rate to a first flow rate. Mass flow controller 170 may pulse the flow rate from the first flow rate back to the nominal flow rate. Mass flow controller 170 may also pulse the flow rate from the first flow rate to a second flow rate. Step 540 may comprise pulsing the flow rate based on operational factors. Step 540 may comprise pulsing the flow rate at any suitable frequency, and throughout the CVI/CVD process. For example, in response to mass flow controller 170 pulsing the flow rate, the boundary layer of the reactant gas may be initially disturbed, reducing the mass transfer resistance. The boundary layer may then stabilize as the flow rate stabilizes. Therefore, to disturb the boundary layer and enhance the mass transfer process, mass flow controller 170 may intermittently pulse the reactant gas flow again.

In various embodiments, method 500 may comprise repeating step 540, as desired (step 550). In this regard, mass flow controller 170 may pulse the flow rate between the nominal flow rate, the first flow rate, and the second flow rate, to thin the boundary layer of the reactant gas passing through porous structure stacks 140, throughout the CVI/CVD process. Step 550 may comprise repeating step 540 based on the operational factors.

During a CVI/CVD process, a furnace may typically operate at temperatures above 1877° F. (1025° C.), while flowing reactant gas that has been heated to around 3632° F. (2000° C.). As such, materials used in the manufacture of various furnace components shown in FIGS. 1, 2, and 3, may be selected based on a material's ability to withstand extremely high temperatures. Alternatively, furnace components may be positioned away from areas in and around the furnace where the temperatures are highest.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosures. The scope of the disclosures is accordingly to be limited by nothing other than the appended claims and their legal equivalents, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for densifying an annular porous structure, comprising:
 a vessel;
 a graphite susceptor disposed within the vessel, wherein the graphite susceptor supports the annular porous structure;
 a reactant gas feed line configured to flow reactant gas into the graphite susceptor, wherein the reactant gas is flowed at a nominal flow rate; and
 a mass flow controller in fluid communication with the reactant gas feed line, wherein the mass flow controller is configured to:
  pulse the reactant gas from the nominal flow rate to a first flow rate based on operational factors, wherein the first flow rate is different from the nominal flow rate, and
  pulse the reactant gas from the first flow rate to a second flow rate based the operations factors, wherein the second flow rate is different from the first flow rate and the nominal flow rate.

2. The system of claim 1, further comprising a preheater, wherein the preheater is configured to receive the reactant gas from the reactant gas feed line, heat the reactant gas to a defined temperature, and flow the reactant gas into the graphite susceptor.

3. The system of claim 1, wherein the reactant gas comprises at least one of methane, ethane, propane, cyclopentane, hydrogen, nitrogen, helium, argon, or an alkane.

4. The system of claim 1, wherein the mass flow controller is configured to pulse the reactant gas at the nominal flow rate based on an operational factor of the vessel of a furnace.

5. The system of claim 4, wherein the operational factor comprises at least one of a process temperature, a graphite susceptor volume pressure, a reactant gas concentration, a material property of the annular porous structure, an amount of porous structures loaded into the vessel of the furnace, a furnace geometry of the furnace, or a graphite susceptor geometry of the graphite susceptor.

* * * * *